United States Patent [19]

Yamamura et al.

[11] Patent Number: 5,296,063
[45] Date of Patent: Mar. 22, 1994

[54] METHOD FOR MOUNTING A SEMICONDUCTOR DEVICE

[75] Inventors: Keiji Yamamura, Sakurai; Takashi Nukii, Nara, both of Japan

[73] Assignee: Sharp Kabushiki Kaisha, Osaka, Japan

[21] Appl. No.: 944,008

[22] Filed: Sep. 11, 1992

Related U.S. Application Data

[63] Continuation of Ser. No. 673,210, Mar. 20, 1991, abandoned.

[30] Foreign Application Priority Data

Mar. 20, 1990 [JP] Japan ................... 2-70296
Oct. 12, 1990 [JP] Japan ................... 2-274650

[51] Int. Cl.$^5$ ............................ B32B 3/00
[52] U.S. Cl. ......................... 156/64; 156/98; 156/273.7; 156/273.9; 156/275.5; 156/275.7
[58] Field of Search ............ 156/378, 297, 299, 275.5, 156/275.7, 272.2, 64, 273.9, 344, 306.3, 247, 98, 152, 273.5, 273.7; 29/832, 428, 458; 437/183; 174/88 R

[56] References Cited

U.S. PATENT DOCUMENTS

| | | | |
|---|---|---|---|
| 4,239,576 | 12/1980 | Taki et al. | 156/299 X |
| 4,458,412 | 7/1984 | Dean et al. | 156/378 X |
| 4,469,553 | 9/1984 | Whitehead | 156/378 X |
| 4,717,605 | 1/1988 | Urban et al. | 156/64 X |
| 4,744,850 | 5/1988 | Imano et al. | 156/275.5 X |
| 4,817,849 | 4/1989 | Yamamoto et al. | 156/64 X |
| 4,859,268 | 8/1989 | Joseph et al. | 156/275.7 X |
| 4,880,486 | 11/1989 | Maeda | 156/275.7 X |
| 4,941,255 | 7/1990 | Bull | 156/64 X |
| 4,980,002 | 12/1990 | Dzarnoski, Jr. et al. | 156/64 |
| 5,048,178 | 9/1991 | Bindra et al. | 156/64 X |
| 5,065,505 | 11/1991 | Matsubara et al. | 156/275.5 X |

FOREIGN PATENT DOCUMENTS

| | | |
|---|---|---|
| 0321238 | 6/1989 | European Pat. Off. . |
| 223623 | 1/1990 | Japan . |
| 0004546 | 1/1991 | Japan ................ 156/275.5 |

OTHER PUBLICATIONS

EP 91 30 2413 European Patent Office, European Search Report, Jun. 1991.

Primary Examiner—David A. Simmons
Assistant Examiner—Chester T. Barry
Attorney, Agent, or Firm—David G. Conlin; Robert F. O'Connell

[57] ABSTRACT

A method for mounting a semiconductor device wherein a semiconductor device on which connection electrodes are formed is connected to a circuit board on which electrodes are formed in positions corresponding to the connection electrodes of the semiconductor device, the method including steps of applying an adhesive on a connection face of the semiconductor device to the circuit board or that of the circuit board to the semiconductor device, aligning the electrodes in positions corresponding to each other with the semiconductor device opposed to the circuit board, partially curing the adhesive in portions other than the electrodes, electrically evaluating the connection of the semiconductor device to the circuit board, and curing the uncured adhesive.

7 Claims, 5 Drawing Sheets

LIGHT RADIATION

LIGHT RADIATION

METHOD FOR MOUNTING A SEMICONDUCTOR DEVICE

This is a continuation of copending application Ser. No. 07/673,210 filed on Mar. 20, 1991, now abandoned.

BACKGROUND OF THE INVENTION

1. Field of the Invention

The present invention relates to a method for mounting a semiconductor device wherein the semiconductor device is mounted on a circuit board by means of an adhesive.

2. Description of the Prior Art

Referring to a method for mounting a semiconductor device wherein an electrode of the semiconductor device and that of a circuit board are pressurized and connected in a so-called face-down state where they are opposed to each other and then fixed by means of a light setting adhesive, a heating step is not needed. Consequently, the semiconductor device and circuit board are not thermally damaged. The electrodes are connected to each other with pressure. Accordingly, an electrode material is not limited to a material which can be bonded by metals, i.e., can be soldered. In addition, steps can be carried out simply and quickly.

Conventionally, there has been known a method for mounting a semiconductor device with pressure by means of a light setting adhesive wherein the light setting adhesive is applied on a connection face of the semiconductor device to a circuit board or that of the circuit board to the semiconductor device, the semiconductor device and circuit board are opposed to each other and pressurized so as to electrically conduct electrodes in corresponding positions, and then the light setting adhesive is cured in order to mount the semiconductor device (see Japanese Unexamined Patent Publication No. 2-23623).

According to the conventional method, in the case where defects in the semiconductor device or in connection of the semiconductor device to the circuit board are found as a result of an electric test after mounting so that it is required to exchange the semiconductor device, external force is applied between the semiconductor device and the circuit board so as to break a cured matter of the light setting adhesive on the connection face, remove the semiconductor device from the circuit board and then mount another semiconductor device again. In this case, however, the cured matter of the light setting adhesive remains on an electrode of the circuit board. Consequently, the cured matter should be removed completely before mounting another semiconductor device.

SUMMARY OF THE INVENTION

The present invention provides a method for mounting a semiconductor device wherein a semiconductor device on which connection electrodes are formed is connected to a circuit board on which electrodes are formed in positions corresponding to the connection electrodes of the semiconductor device, the method comprising steps of applying an adhesive on a connection face of the semiconductor device to the circuit board or that of the circuit board to the semiconductor device, aligning the electrodes in positions corresponding to each other with the semiconductor device opposed to the circuit board, partially curing the adhesive in portions other than the electrodes, electrically evaluating the connection of the semiconductor device to the circuit board, and curing the uncured adhesive.

The circuit board may be translucent and the adhesive may have light setting properties.

The electrode of the semiconductor device and that of the circuit board may electrically be connected to each other with pressure through conductive particles.

The electrode of the semiconductor device may be a bump electrode and may electrically be connected to the electrode of the circuit board with pressure.

Preferably, the method for mounting a semiconductor device further comprises a step of pressurizing the semiconductor device onto the circuit board between the steps of aligning and partially curing the adhesive.

In the case where defects in connection are found in the step of electrically evaluating the connection of the semiconductor device to the circuit board, shear force is applied to the mounted semiconductor device to be removed from the circuit board and the adhesive is further supplied onto the circuit board to mount another semiconductor device on the circuit board.

DETAILED DESCRIPTION OF PREFERRED EMBODIMENTS

There will be described first and second embodiments of the present invention in detail with reference to the drawings. The present invention is not limited to the embodiments to be described below.

First Embodiment

Figure 1:
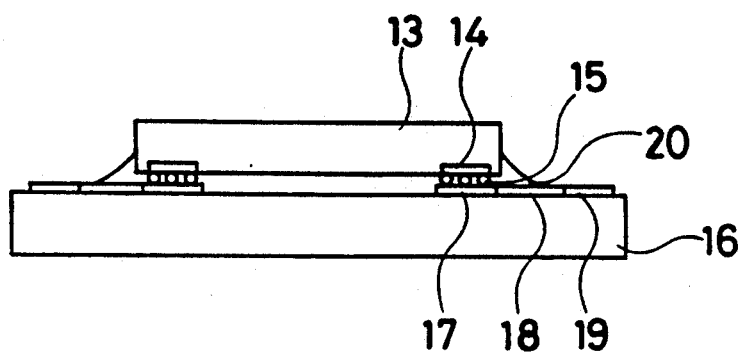
FIG. 1 is a view showing a structure in which a semiconductor device is mounted on a circuit board according to a first embodiment of the present invention.

FIG. 1 is a section view showing a structure in which a semiconductor device 13 is mounted on a circuit board 16. The semiconductor device 13 is made of a material such as silicon or gallium arsenic. The semiconductor device 13 has an integrated circuit formed on one of surfaces thereof. The integrated circuit includes a lot of transistors, diodes and the like (not shown). An electrode 14 to be connected to a connection electrode 17 on the circuit board 16 is formed on the periphery of the integrated circuit. Conductive particles 15 as connection members are disposed on the electrode 14 (see Japanese Unexamined Patent Publication No. 2-23623 for further details of the conductive particles 15). The circuit board 16 is formed of a translucent material such as glass. The electrode 17 having the size corresponding to the electrode 14 is formed in a position corresponding to the electrode 14 on one of surfaces of the circuit board 16. The electrode 17 is connected to an electrode 19 for an electric test through a wire 18. The electrode 19 for an electric test is formed on the circuit board 16. The electrode 14 of the semiconductor device 13 is electrically connected to the electrode 17 of the circuit board 16 with pressure through the conductive particles 15. In this state, the semiconductor device 13 is fixed onto the circuit board 16 by means of a light setting adhesive 20 (for example, No. 350 manufactured by Nippon Lock Tight Kabushiki Kaisha).

There will be described a method for mounting a semiconductor device shown in FIG. 1 with reference to FIGS. 2a to 2d.

Figure 2A:
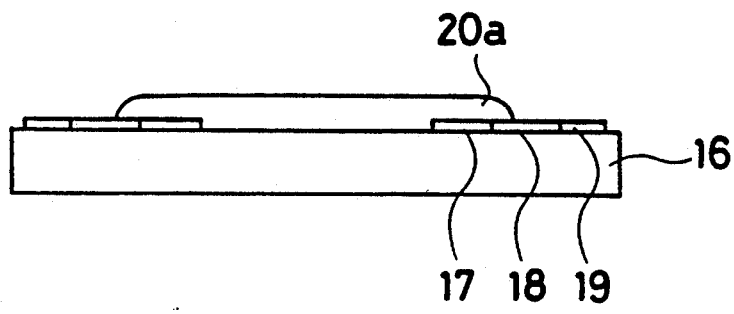
FIGS. 2a to 2d are views showing mounting steps according to the first embodiment of the present invention.

As shown in FIG. 2a, an uncured light setting adhesive layer 20a is formed in a region where the semiconductor device 13 is to be mounted on the circuit board 16 by printing, transfer or dispenser dropping.

Figure 2B:
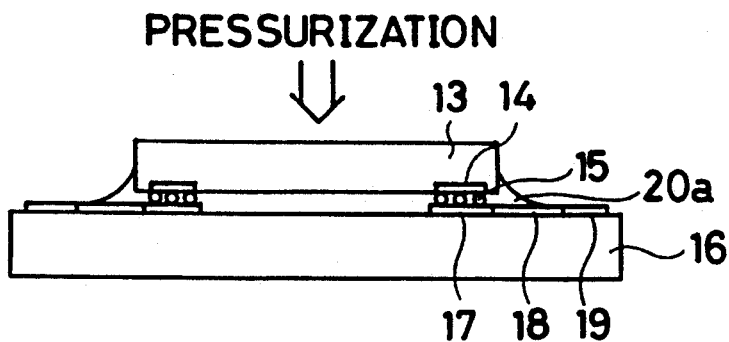

As shown in FIG. 2b, the semiconductor device 13 is disposed and pressurized on the circuit board 16 in such a manner that the electrodes 14 and 17 are opposed to each other.

Figure 2C:
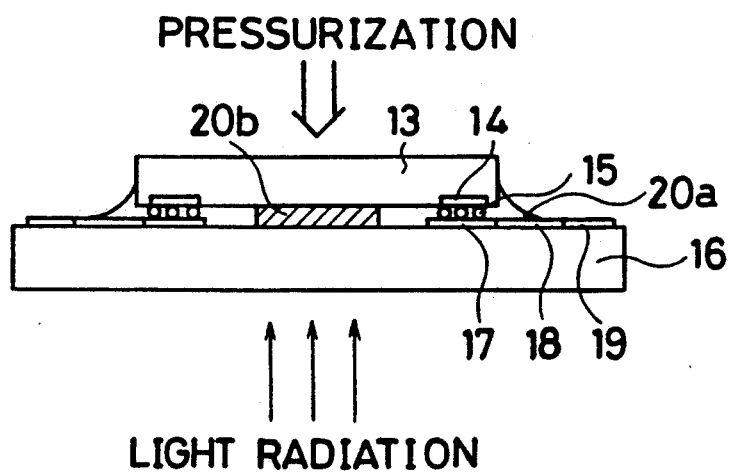

As shown in FIG. 2c, only a light setting adhesive layer 20b is cured by irradiating light having a cure wavelength of the light setting adhesive. The light setting adhesive layer 20b is formed in a region where the electrode 14 of the semiconductor device 13 does not exist between the semiconductor device 13 and the circuit board 16, i.e., a central region. Consequently, the electrode 14 of the semiconductor device 13 is electrically connected to the electrode 17 of the circuit board 16 after pressurization. In addition, the light setting adhesive is kept uncured in an electrode portion.

After pressurization, an electric test is given to the semiconductor device 13 through the electrode 19 for an electric test formed on the circuit board 16.

Figure 2D:
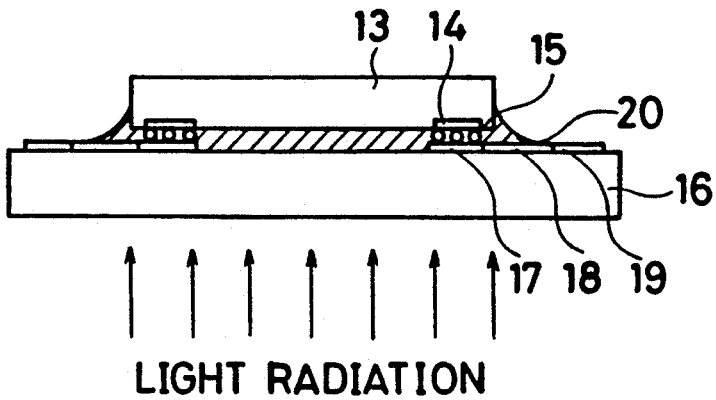

In the case where good results of the electric test are obtained, the light having the cure wavelength of the light setting adhesive is irradiated on an entire region of the light setting adhesive layer 20 through the circuit board 16 so that the uncured light setting adhesive is cured as shown in FIG. 2d. As a result, mounting is completed. In this case, the light passing through the back of the circuit board 16 is reflected and scattered by the semiconductor device 13 so that the light setting adhesive layer 20 of the electrode 17 is cured. Consequently, it is not required to always use a transparent electrode for the electrode 17.

On the other hand, in the case where defects are found as a result of the electric test, it is required to remove the mounted semiconductor device 13 and then mount another semiconductor device again.

Figure 3A:
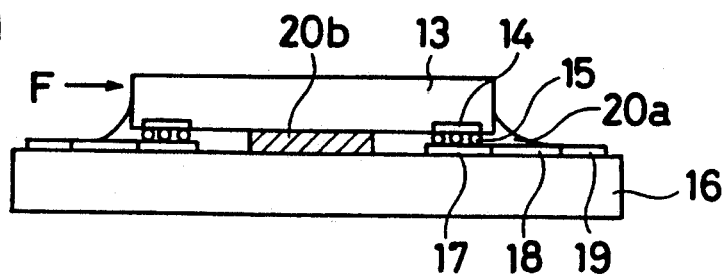
FIGS. 3a to 3c are views showing a method for exchanging the mounted semiconductor device.
Figure 3B:
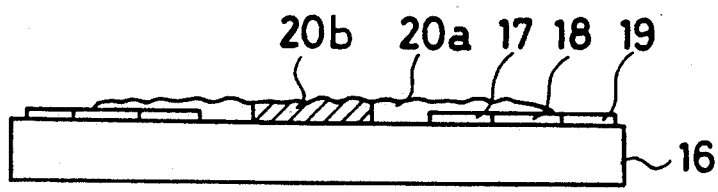
Figure 3C:
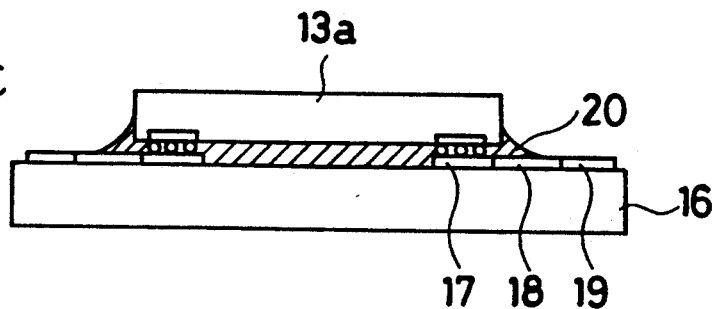

There will be described a method for exchanging the mounted semiconductor device with reference to FIGS. 3a to 3c. As shown in FIG. 3a, shear force F is applied to the semiconductor device 13 mounted on the circuit board 16. Consequently, the semiconductor device 13 is removed from the circuit board 16 as shown in FIG. 3b. If the above-mentioned work is carried out with the circuit board 16 heated, the strength of the light setting adhesive 20 is lowered. Consequently, the semiconductor device 13 can be removed from the circuit board 16 with smaller force. In such a case, a heating temperature depends on physical properties of the light setting adhesive. Preferably, the heating temperature is 100° to 200° C. As shown in FIG. 3b, the cured matter 20b of the light setting adhesive exists in a central portion of a semiconductor device mounting region, in which the connection electrode 17 is not provided, on the circuit board 16. The light setting adhesive 20a in a peripheral portion including the electrode 17 is kept uncured.

The light setting adhesive is further supplied onto the semiconductor device mounting region of the circuit board 16 by a dispenser dropping method or the like. Then, another semiconductor device 13a is mounted according to the method for mounting a semiconductor device mentioned above (see FIG. 3c).

Second Embodiment

Figure 4:
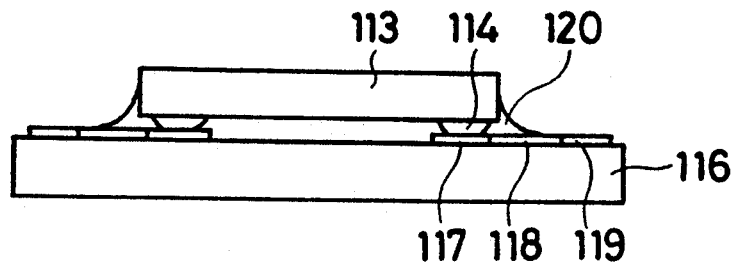
FIG. 4 is a view showing a second embodiment of the present invention correspondingly to FIG. 1.

FIG. 4 is a section view showing a structure in which a semiconductor device 113 is mounted on a circuit board 116. The semiconductor device 113 is made of a material such as silicon or gallium arsenic. The semiconductor device 113 has an integrated circuit formed on one of surfaces thereof. The integrated circuit includes a lot of transistors, diodes and the like (not shown). A bump electrode 114 to be connected to a connection electrode 117 on the circuit board 116 is formed on the periphery of the integrated circuit. The circuit board 116 is formed of a translucent material such as glass. The electrode 117 having the size corresponding to the bump electrode 114 is formed in a position corresponding to the bump electrode 114 on one of surfaces of the circuit board 116. The electrode 117 is connected to an electrode 119 for an electric test through a wire 118. The electrode 119 for an electric test is formed on the circuit board 116. The bump electrode 114 of the semiconductor device 113 is electrically connected to the electrode 117 of the circuit board 116 with pressure. In this state, the semiconductor device 113 is fixed onto the circuit board 116 by means of a light setting adhesive 120.

There will be described a method for mounting a semiconductor device shown in FIG. 4 with reference to FIGS. 5a to 5d.

Figure 5A:
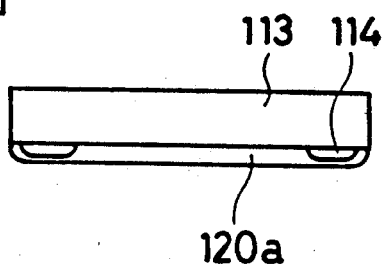
FIGS. 5a to 5d are views showing mounting steps according to the second embodiment of the present invention.

As shown in FIG. 5a, an uncured light setting adhesive layer 120a is formed on the side, on which the bump electrode 114 of the semiconductor device 113 is formed, by printing, transfer or dispenser dropping.

Figure 5B:
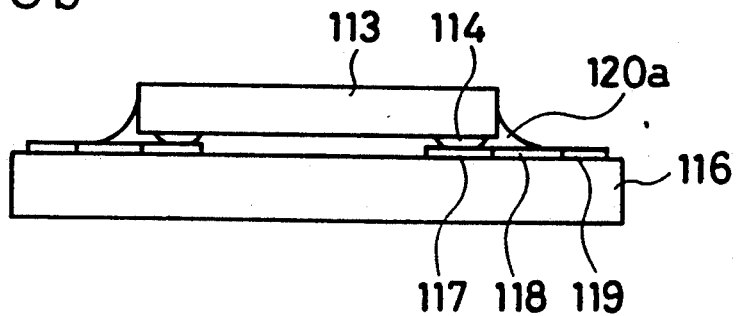

As shown in FIG. 5b, the semiconductor device 113 is aligned and disposed on the circuit board 116 in such a manner that the bump electrode 114 is opposed to the electrode 117.

Figure 5C:
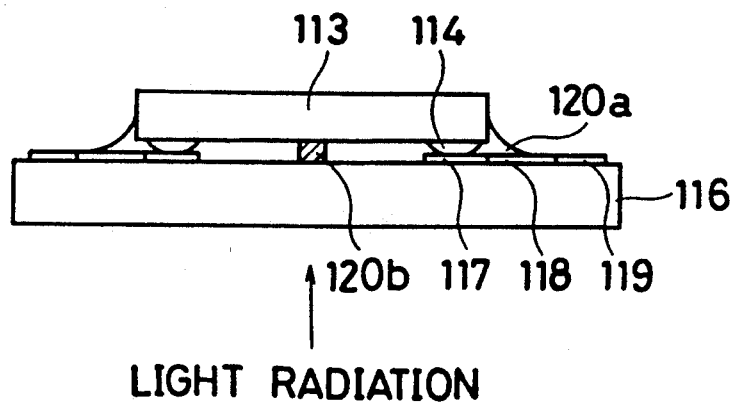

As shown in FIG. 5c, only a light setting adhesive layer 120b is cured by irradiating light having a cure wavelength of the light setting adhesive. The light setting adhesive layer 120b is formed in a region where the bump electrode 114 of the semiconductor device 113 does not exist between the semiconductor device 113 and the circuit board 116, i.e., a central region. Consequently, the semiconductor device 113 is temporarily fixed onto the circuit board 116. In such a state, it is not required to always connect the bump electrode 114 of the semiconductor device 113 to the electrode 117 of the circuit board 116 electrically.

Then, the semiconductor device 113 is pressurized on the circuit board 116 so as to electrically connect the bump electrode 114 of the semiconductor device 113 to the electrode 117 of the circuit board 116. In this state, an electric test is given to the semiconductor device 113 through the electrode 119 for an electric test formed on the circuit board 116.

Figure 5D:
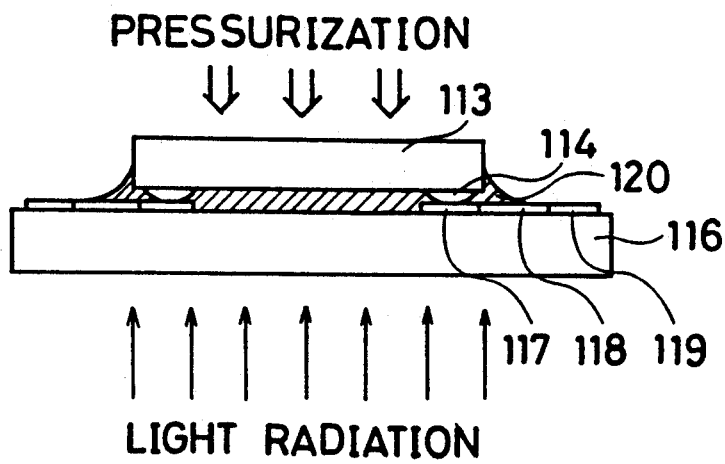

In the case where good results of the electric test are obtained, the light having the cure wavelength of the light setting adhesive is irradiated on an entire region of the light setting adhesive layer 120 through the circuit board 116 in a state where the semiconductor device 113 is pressurized on the circuit board 116 as shown in FIG. 5d. Consequently, the uncured light setting adhesive is cured. As a result, mounting is completed.

On the other hand, in the case where defects are found as a result of the electric test, it is required to remove the mounted semiconductor device 113 and then mount another semiconductor device again according to the method for mounting a semiconductor device in similar to the first embodiment.

While there have been described the case where the conductive elastic particles are disposed on the electrode so as to mount the semiconductor device on the circuit board and the case where the semiconductor device having the metallic bump electrode is mounted on the circuit board, a connection structure of the electrodes of the semiconductor device is not limited to the above-mentioned embodiments. It is needless to say that the present invention can be applied to a semiconductor device capable of being mounted with pressure by means of a light setting adhesive.

According to the present invention, there is cured only a light setting adhesive on a connection face of the semiconductor device to the circuit board in a central region where electrodes do not exist. Then, an electric test is given. Consequently, even if defects in the semiconductor device or in connection of the semiconductor device to the circuit board are found as a result of the electric test so that it is required to exchange the semiconductor device, another semiconductor device can easily be mounted again without removing the light setting adhesive on the circuit board.

What is claimed is:

1. A method for mounting a semiconductor device wherein a semiconductor device on which connection electrodes are formed is connected to a circuit board on which circuit electrodes are formed in positions corresponding to the connection electrodes of the semiconductor device, the method comprising the following steps in the order named:
   (a) applying an adhesive on a face of the semiconductor device to be connected to the circuit board or on a face of the circuit board to be connected to the semiconductor device,
   (b) aligning the connection electrode and the circuit electrodes in positions corresponding to each other with the semiconductor device opposed to the circuit board,
   (c) curing only predetermined portions of the adhesive located at regions other than regions where the electrodes are aligned to tack the semiconductor device to the circuit board,
   (d) electrically evaluating the semiconductor device and the connection of the semiconductor device to the circuit board,
   (e) removing the device from the board if a defect in the device or in the connection thereof is found and repeating the steps (a) through (d) to mount another semiconductor device on the board, and
   (f) curing remaining portions of the adhesive not cured in step (c) to permanently bond the device to the board if no defects in the device and in the connection of the device to the circuit board are found.

2. A method for mounting a semiconductor device according to claim 1, wherein the circuit board is translucent and the adhesive has light setting properties.

3. A method for mounting a semiconductor device according to claim 1, wherein the electrodes of the semiconductor device and of the circuit board are electrically connected to each other with pressure through conductive particles.

4. A method for mounting a semiconductor device according to claim 1, wherein the electrodes of the semiconductor device are bump electrodes and are electrically connected to the electrodes of the circuit board with pressure.

5. A method for mounting a semiconductor device according to claim 1, further comprising the step (g) of pressurizing the semiconductor device onto the circuit board between steps (b) and (c).

6. A method for mounting a semiconductor device according to claim 1, wherein in the case where a defect in the device or in the connection thereof is found in step (d), a shear force is applied to the mounted semiconductor device to remove the device from the circuit board in step (d) and adhesive is further supplied onto the circuit board.

7. A method for mounting a semiconductor device according to claim 6, wherein the circuit board is preheated before removing the semiconductor device therefrom.

* * * * *